(12) United States Patent
Reynes et al.

(10) Patent No.: US 7,800,135 B2
(45) Date of Patent: Sep. 21, 2010

(54) POWER SEMICONDUCTOR DEVICE AND METHOD OF MANUFACTURING A POWER SEMICONDUCTOR DEVICE

(76) Inventors: Jean-Michel Reynes, Place du Chateau, Pompertuzat (FR) 31450; Stephane Alves, rue du Professor Martin, Toulouse (FR) 31500; Alain Deram, Allee du Vallon, Colomiers (FR) 31770; Blandino Lopes, Place de la Clape, Auzeville Tolosane (FR) 31320; Joel Margheritta, Square Elsa Triolet, Seysses (FR) 31600

( * ) Notice: Subject to any disclaimer, the term of this patent is extended or adjusted under 35 U.S.C. 154(b) by 240 days.

(21) Appl. No.: 11/996,681

(22) PCT Filed: Jul. 25, 2005

(86) PCT No.: PCT/EP2005/010049

§ 371 (c)(1),
(2), (4) Date: Jan. 24, 2008

(87) PCT Pub. No.: WO2007/016969

PCT Pub. Date: Feb. 15, 2007

(65) Prior Publication Data

US 2008/0217657 A1 Sep. 11, 2008

(51) Int. Cl.
H01L 29/74 (2006.01)
H01L 21/8238 (2006.01)
(52) U.S. Cl. .............. 257/204; 257/107; 257/E29.125; 257/E27.079; 257/E29.211; 438/222
(58) Field of Classification Search ............... 257/204, 257/E29.125, E27.079, E29.211; 438/222, 438/FOR. 237
See application file for complete search history.

(56) References Cited

U.S. PATENT DOCUMENTS

| 4,376,286 A | 3/1983 | Lidow et al. |
| 4,593,302 A | 6/1986 | Lidow et al. |
| 5,075,739 A | 12/1991 | Davies |

(Continued)

FOREIGN PATENT DOCUMENTS

EP 0335750 A 10/1989

(Continued)

OTHER PUBLICATIONS

"A New Vertical Double Diffused MOSFET—The Self-Aligned Terraced-Gate MOSFET" IEEE Transactions on Electron Devices, Apr. 1984.

*Primary Examiner*—Jerome Jackson, Jr.
*Assistant Examiner*—Dale Page

(57) ABSTRACT

A semiconductor power switch having an array of basic cells in which peripheral regions in the active drain region extend beside the perimeter of the base-drain junction, the peripheral regions being of higher dopant density than the rest of the second drain layer. Intermediate regions in the centre of the active drain region are provided of lighter dopant density than the rest of the second drain layer. This provides an improved compromise between the on-state resistance and the breakdown voltage by enlarging the current conduction path at in its active drain region. On the outer side of each edge cell of the array, the gate electrode extends over and beyond at least part of the perimeters of the base-source junction and the base-drain junction towards the adjacent edge of the die. Moreover, on the outer side of each edge cell, the second drain layer includes a region of reduced dopant density that extends beyond the gate electrode right to the adjacent edge of the die.

10 Claims, 3 Drawing Sheets

U.S. PATENT DOCUMENTS

| | | |
|---|---|---|
| 5,703,389 A | 12/1997 | Knoch et al. |
| 6,144,067 A | 11/2000 | Kinzer |
| 2003/0057478 A1 | 3/2003 | Yun et al. |

FOREIGN PATENT DOCUMENTS

| | | | |
|---|---|---|---|
| EP | 0583911 A | | 2/1994 |
| EP | 0655787 A2 | | 5/1995 |
| EP | 0827209 A1 | | 3/1998 |
| EP | 1387408 A1 | | 2/2004 |
| WO | 0131709 | | 5/2001 |
| WO | 0131711 | | 5/2001 |
| WO | 03107432 A1 | | 12/2003 |

POWER SEMICONDUCTOR DEVICE AND METHOD OF MANUFACTURING A POWER SEMICONDUCTOR DEVICE

FIELD OF THE INVENTION

This invention relates to a power semiconductor device, especially a Metal Oxide Semiconductor Field Effect Transistor ('MOSFET'), and a method of manufacturing such a power semiconductor device.

BACKGROUND OF THE INVENTION

Semiconductor devices such as MOSFETs have been used in power electronics applications due to their appreciable off-state voltage blocking capability and on-state current carrying capacity with low on-state resistance $R_{DSON}$. In terms of industrial applications, power MOSFET devices are commonly used in many electronics fields such as portable electronics, power supplies and telecommunications and more particularly in many industrial applications relating to automotive electronics.

Conventionally, an insulated gate FET (IGFET) configuration for a power MOSFET has a four-layer structure of alternating p-type and n-type doping superposed vertically in the body of the semiconductor die, that is to say superposed in a direction perpendicular to the main faces of the die. An example of this type of structure is the n+pn–n+ structure termed enhancement mode n-channel MOSFET. Source and gate electrodes are positioned in arrays of cells at one face of the device, the source electrodes contacting the source regions formed at the substrate surface in the first n+ layer and the gates being disposed over base regions in the p layer, insulated from the semiconductor material by an oxide or other insulating layer. One or more drain electrodes are disposed at the opposite face of the device contacting the opposite n+ layer in the substrate. By applying a voltage higher than a threshold level, which biases the gate positive with respect to the source, an n-type inversion layer or channel will be formed in the base regions under the gate oxide layer through the p-type layer of the cells, thus forming a connecting layer between the source and the drain regions and allowing a current to flow. Once the device is turned on, the relation between the current and the source-drain voltage is nearly linear which means that the device then behaves like a resistance. The on-state resistance $R_{DSON}$ should be as low as possible.

A high cell density insulated gate IGFET configuration is preferred because of the low on-state resistance per unit area it offers. An example of high cell density vertical IGFET configurations is given in U.S. Pat. No. 6,144,067, which describes a power MOS gated device with a strip gate poly structure to increase channel width while reducing the gate resistance. Other examples of IGFET are described in international patent applications WO 01/31711 and WO 01/31709, in which a single continuous base region has an undulating structure; both devices implement a single well region made by a layout where either the gate layer substantially surrounds the base region, or the base region, which is composed of a plurality of branches, substantially surrounds the gate layer of the transistor. U.S. Pat. No. 5,703,389 describes a vertical IGFET configuration having a stripe configuration wherein the stripe regions have a non linear shape that leads to an increase of the channel density.

European patent specification EP 1 387 408 describes a low on-state resistance power semiconductor device in which each individual cell comprises a plurality of radially extending branches having source regions within base regions, at least one branch of each cell extending towards at least one branch of an adjacent cell; the base regions of the extending branches are merged together to form a single and substantially uniformly doped base region well surrounding drain islands at the surface of the semiconductor substrate. Other semiconductor devices having base regions common to an array of cells are described in European patent specifications EP 0 655 787 and EP 0 827 209.

In spite of the various design features adopted, a problem that increases with increasing the cell or channel density is maintaining or improving the breakdown voltage. The different configurations referred to above address the issue of breakdown voltage but there remains a conflict between reducing on-state resistance, especially by increasing the channel density, and improving breakdown voltage.

SUMMARY OF THE INVENTION

The present invention provides a semiconductor device and a method of making a semiconductor device as described in the accompanying claims.

DETAILED DESCRIPTION OF PREFERRED EMBODIMENTS

Figure 1:
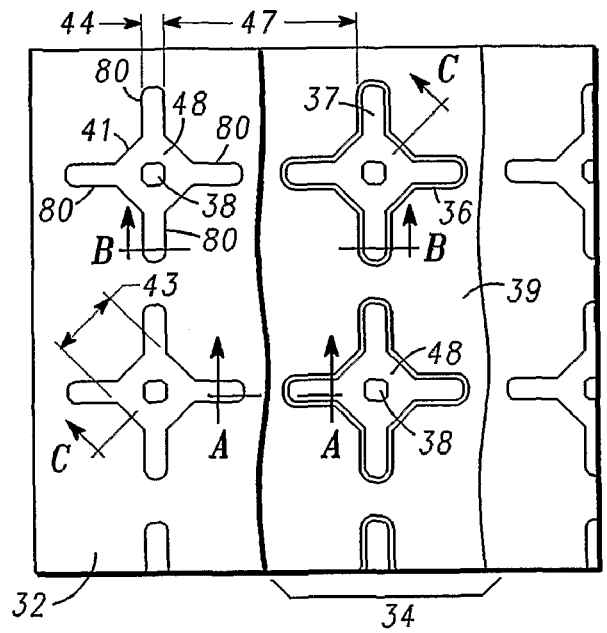
FIG. 1 is a top view of individual cells with four branches arranged crosswise in a semiconductor device before a base region merge operation, the configuration being similar in an embodiment described in European patent specification EP 1 387 408 and in an embodiment of the present invention, given by way of example.

The semiconductor device shown in FIGS. 1 to 6 is a vertical insulated gate field-effect power transistor semiconductor device. The configuration of the device comprises an array of cells (only part of which is shown in the drawings) formed in a die of semiconductor material presenting a first face 2 and a second face 4 opposite to the first face. A drain electrode 6 is disposed on the second face 4 and contacts a first drain layer 8 of a first conductivity type that extends from the second face 4. A second superposed drain layer 10 also of the first conductivity type but having a lower dopant density than the first drain layer 8 extends from the first drain layer to the first face 2. Each of the basic cells comprises a source region 37 of the first conductivity type extending from the first face 2 and a base region 36 of the opposite conductivity type surrounding the source region at and below the first face. The base region 36 forms with the source and drain regions 37 and 36 respectively a base-source junction 12 and a base-drain junction 14, both the junctions extending to the first face so as to define respective junction perimeters 16 and 18 thereat. A gate electrode 32 insulated from the die by an insulating layer is disposed at the first face over at least part of the perimeters 16 and 18 of the base-source junction and the base-drain junction at the first face. In operation, to switch the device to the current-carrying on-state, a voltage is applied to the gate electrode 32 with the appropriate polarity (positive in the case illustrated in the drawings of an n+pnn+device) to form a conductive channel in the base region 36 between the source region 36 and the drain layer 10.

FIG. 1 depicts in more detail, at a stage in manufacture before a base region merge operation, a top view of individual basic cells in the configuration illustrated by way of example, with the perimeters 16 and 18 of the base-source junction 12 and a base-drain junction 14 at the face 2 defining four branches arranged crosswise. This arrangement aims at having improved channel density and low on-state resistance.

In order to provide a more complete view of the structure beneath the insulated gate electrode, which is formed by a polysilicon layer 32, a middle portion 34 without the insulated gate electrode 32 is shown in this FIG. 1 to expose the face 2 of the semiconductor die. In that middle portion, each branch 80 of the cell is seen to include a source region 37 within a base region 36 defined by the peripheries 16 and 18. The base region 36 also extends under the source region 37 to surround the source region in the substrate of the die.

In this example of semiconductor device configuration, the base region 36 is a P-conductivity doped region in a semiconductor material that is used to provide a current channel for an IGFET. The current channel is controlled by the overlying insulated gate layer 32.

Figure 2:
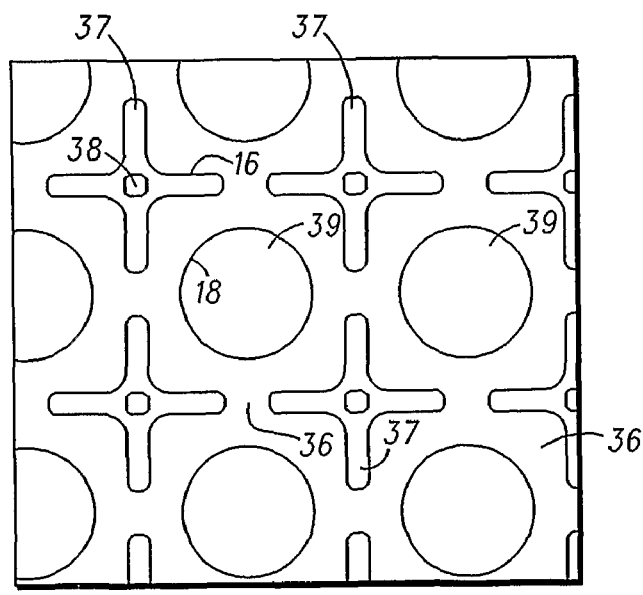
FIG. 2 is a top view of a semiconductor device after the base region merge operation, the configuration being similar in a variant of the embodiment described in European patent specification EP 1 387 408 and in a variant embodiment of the present invention, given by way of example.

An active region 39 of the less highly doped second drain layer 10, appears at the face 2 between the base regions 36 of adjacent cells of the array. The adjacent cells of the array are aligned and their P High Voltage ('PHV') base regions 36 are connected to each other by a merge operation of adjacent PHV regions at the ends of the branches 80 underneath the face 2 and the insulated gate electrode 32, as shown in FIG. 2 and as described in more detail in our European patent specification EP 1 387 408.

In the configuration shown in FIG. 1, the four branches 80 of each individual basic cell extend in straight lines and are linked to each other by four straight links 41. However, alternatively these branches may have a non-linear or undulating shape. The four branches may be linked by concave curving links as shown in FIG. 2, which increases the breakdown voltage capability.

The width of the source region 37 in each branch 80 is less than the widest distance 43 between radially opposed links 41 within the cell.

The structural dimensions of the individual cells depend on the voltage range. In one embodiment, the width 44 of each branch 80 is of the order of a few microns and, more particularly, in a range from approximately 1.0 to 3.5 microns and the widest distance 43 in the cell between radially opposed links 41 is approximately 0.5 to 2.0 microns greater than width 44. Each cell branch 80 has a length 46 less than 10 microns and in this embodiment is within a range from 2.5 to 5.0 micron. The spacing 47 between corresponding parallel branches 80 of adjacent cells is in a range from approximately 3.0 to 7.0 microns and in this embodiment is between 4.0 to 5.0 micron. Smaller dimensions may be adopted, enabling increased cell density, the ultimate limit of the width 44 of each branch being defined by the photolithographic process capability.

In an example of a method of making the semiconductor device illustrated, the base and source regions 36 and 37 are formed after insulated gate electrode 32 has been deposited onto the face 2 of the semiconductor material. After the four branches 80 are defined by etching the polysilicon of the gate electrode 32, the base region 36 is formed first followed by source region 37 by incorporating the appropriate dopants type (N-type or P-type) into the underlying semiconductor material.

As shown in FIG. 2, the merge operation merges the adjacent base regions 36 in the vicinity of the adjacent ends of the branches of the adjacent cells to create the contact between these well regions, by heating the die, before the source dopant is introduced into the die. Alternatively, instead of using masking and diffusion to obtain a single body region 36, an additional masking and implant step could be added to merge the adjacent body regions of adjacent individual cells. Further details of suitable manufacturing processes are described in our European patent specification EP 1 387 408, the teaching of which is incorporated herein by reference.

After the merge operation, the second drain layer 10 reaches the face 2 of the die only in drain regions 39 that are physically separated at the face 2 even though they connect electrically under the merged base regions 36. The periphery 18 of the base-drain junction is rounded with the base region being concave. This configuration improves breakdown voltage by reducing concentrations of electric fields.

Figure 3:
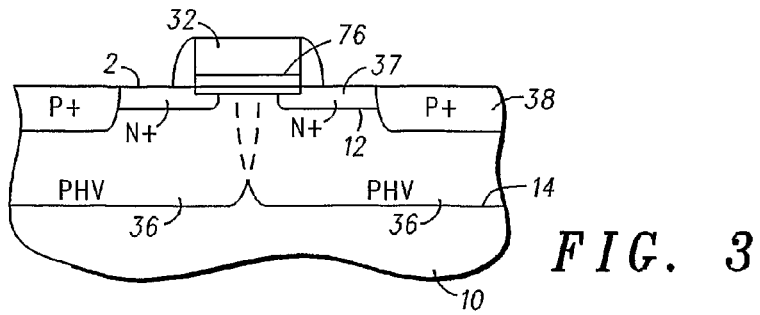
FIG. 3 is a cross-section of the semiconductor devices taken on the line A-A of FIG. 1.
Figure 4:
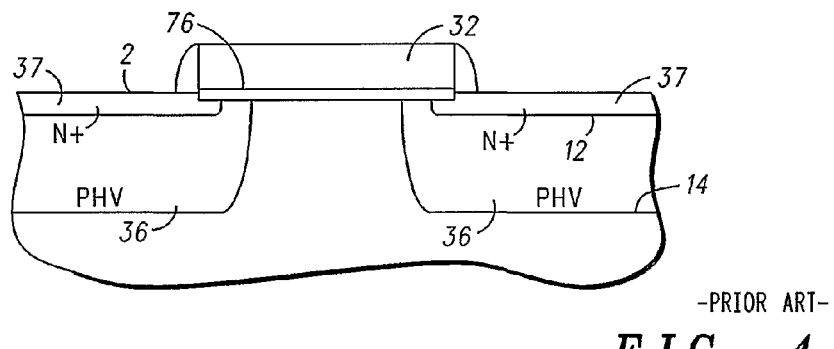
FIG. 4 is a cross-section of the semiconductor devices of European patent specification EP 1 387 408 taken on the line B-B of FIG. 1.

FIG. 3 is a simplified cross-sectional view of a portion of the semiconductor device taken along line A-A of FIG. 1 between the juxtaposed ends of the branches 80 of two adjacent individual cells after the merge operation. FIG. 4 is a similar view of a portion of the semiconductor device of our European patent specification EP 1 387 408 taken along line B-B of FIG. 1 between corresponding parallel branches 80 of two adjacent individual cells after the merge operation.

Figure 5:
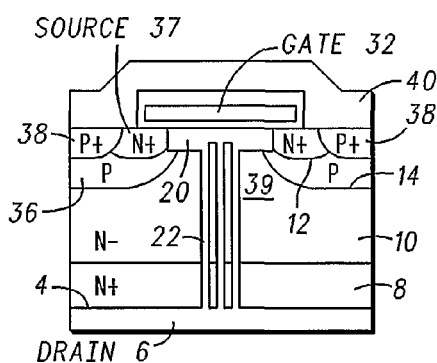
FIG. 5 is a schematic cross-section of the semiconductor devices of European patent specification EP 1 387 408 taken on the line C-C of FIG. 1.
Figure 6:
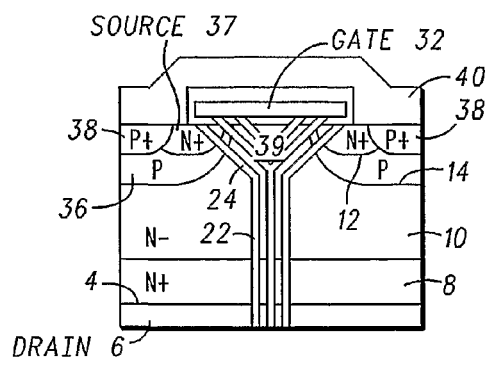
FIG. 6 is a schematic cross-section similar to FIG. 5 taken on the line C-C of FIG. 1 of basic cells within an array in an embodiment of the present invention.

As shown in FIGS. 5 and 6, a heavily doped region 38 of the same polarity as the base region is also provided having a junction in the die substrate with the source region 37 and shorted electrically to the source region by contact with the metal source electrode 40. The purpose of the heavily doped region 38 is to reduce the parasitic NPN or PNP bipolarity phenomenon (also called snap back effect) by ensuring that the base region will always be polarised even when evacuation of a high density of current carriers in the drain region 39 is cut off at the face 2 by switching the gate voltage to the off-state. Thus, the breakdown voltage is improved as well as the Unclamped Inductive Switching (UIS).

FIG. 5 illustrates graphically current flow during the on-state of the prior power switching IGFET of our European patent specification EP 1 387 408, in which the dopant concentration of second drain does not vary substantially, in the direction laterally of the face 2, in the active drain regions 39 where they emerge at the face 2. It will be seen that each conductivity path extends generally parallel to the face 2 at 20 in its active drain region 39, and only extends perpendicular to the face 2 in the substrate to join with the drain electrode at the face 4 of the die at 22 in the central part of the active drain region 39. This restriction of the width of the conduction path penalizes the on-state resistance $R_{DSON}$ but compensating it by increasing the dopant concentration of the second layer 10 would penalize the breakdown voltage. U.S. Pat. Nos. 4,376, 286 and 5,075,739 describe attempts to improve the compromise but further improvement is desirable.

Figure 7:
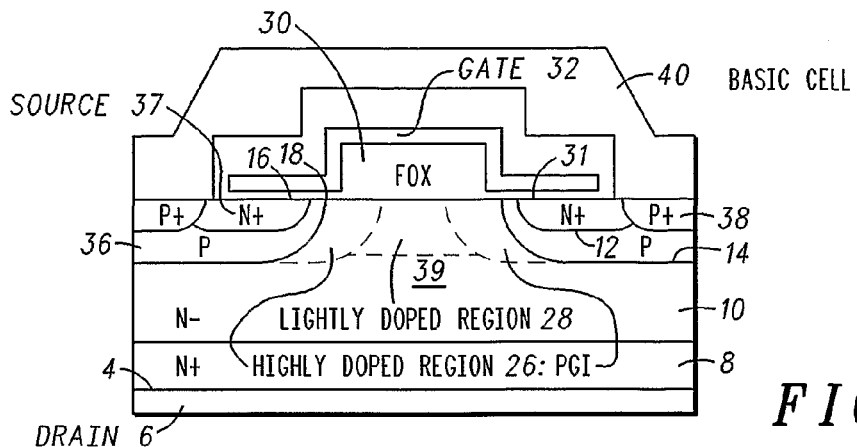
FIG. 7 is a cross-section of the basic cells of FIG. 6 taken on the line C-C of FIG. 1 and showing dopant regions in the device.

This embodiment of the present invention provides an improved compromise between the on-state resistance and the breakdown voltage by enlarging the current conduction path at 24 in its active drain region 39, the current path being 'trumpet' shaped, appearing as a 'Y'-shape in the sectional view of FIG. 6. As shown in FIG. 7, this is achieved by providing peripheral regions 26 in the active drain region 39 extending beside the perimeter of the base-drain junction 18, the peripheral regions being of higher dopant density than the rest of the second drain layer 10. Moreover, intermediate regions 28 in the centre of the active drain region 39 are provided of lighter dopant density than the rest of the second drain layer 10. In order to avoid penalizing the breakdown voltage of the device, the peripheral regions 26 extend no deeper than the base regions 36. However, the higher conductivity of the peripheral regions 26 and their action in enlarging the current conduction path 24 beside the perimeter 18 of the base-drain junction enable the channel resistance $R_{JFET}$ to be reduced.

In this embodiment of the invention, any tendency of the higher dopant peripheral regions 26 to degrade the breakdown voltage of the device is more than compensated by reducing the dopant concentration in the intermediate regions 28.

In this embodiment of the invention, the basic cell configuration is of the kind shown in FIGS. 1 to 3, with four branches 80 of each individual basic cell extending in straight lines, merged base regions 36 in the vicinity of juxtaposed ends of the source regions of adjacent cells and the periphery 18 of the base-drain junction being rounded with the base region being concave. The perimeters 16 and 18 of the junctions and the peripheral regions 26 are all generally ring shaped and concentric. This improves breakdown voltage by reducing electric field concentrations. However, the invention is applicable to other configurations with different numbers of branches in each cell and even to stripe and other shaped cell configurations, such as those described in our European patent specification EP 1 387 408 and other documents referred to in the introduction to this specification.

Moreover, in this embodiment of the invention, as shown in FIG. 7, the lightly doped region is arranged to be under a thicker 'field oxide' layer 30 where space charge extends in the off-state, which also helps to increase the breakdown voltage, whereas the insulating layer, which defines the spacing of the gate electrode 32 from the face 2, is thinner at 31 in the vicinity of said junction perimeters than in areas adjacent said intermediate regions. A method of making a semiconductor device with such a 'terraced' gate oxide layer and self-aligned dopant regions is described in an article by Ueda et al. in IEEE Transactions of Electronic Devices, vol. ED-31 (no.4):416-20 1984, entitled "A new vertical double diffused MOSFET—the self-aligned terraced-gate MOSFET", the teaching of which is incorporated herein by way of reference.

Figure 8:
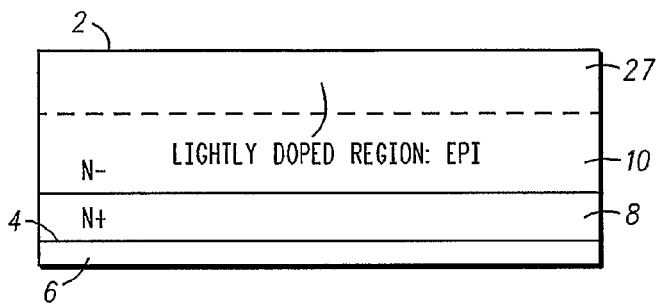
FIGS. 8 and 9 are cross-sections of the basic cells of FIG. 6 taken on the line C-C of FIG. 1 during successive stages of manufacture.
Figure 9:
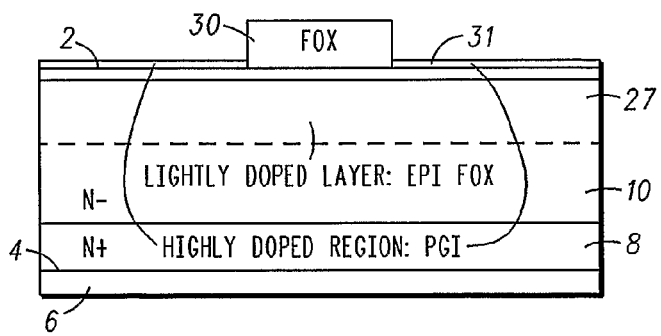

FIGS. 8 and 9 illustrate steps in an example of a method of making the semiconductor device shown in FIGS. 6 and 7. After forming the drain electrode 6 on the face 4 of the die and the first drain layer 8, the second drain layer 10 is formed by epitaxial growth of semiconductor material on the first drain layer. The density of dopant in the second layer 10 is reduced during the final stages of the step shown in FIG. 8 of growing semiconductor material epitaxially on said first drain layer, so as to produce a layer 27 of reduced dopant density, which will remain after forming the source, base and high dopant peripheral regions therein to provide the lightly doped regions 28.

As shown in FIG. 9, the normal and thick oxide layers 31 and 30 are then grown on the face 2 of the die. The gate electrode is then formed over the oxide layers 30 and 31 by growing polysilicon and patterned by etching, using a photoresist mask. Other features of the gate stack, such as spacers for example, are added at different stages in the process. The features of the gate stack are used to define automatically-aligned masking for the steps of forming the source, base and high dopant peripheral regions 37, 36 and 26.

In this example, the high dopant peripheral regions 26 are formed by ion implant of the first conductivity type into the areas of the face 2 of the die left exposed by the oxide layers 30 and 31. The base regions 36 are then formed by diffusion of the opposite conductivity type and are then merged by subjecting the die to a high temperature. Subsequently, the source regions 37 are formed by diffusion of the first conductivity type and the heavily doped regions 38 are formed by diffusion of the opposite conductivity type.

Figure 10:
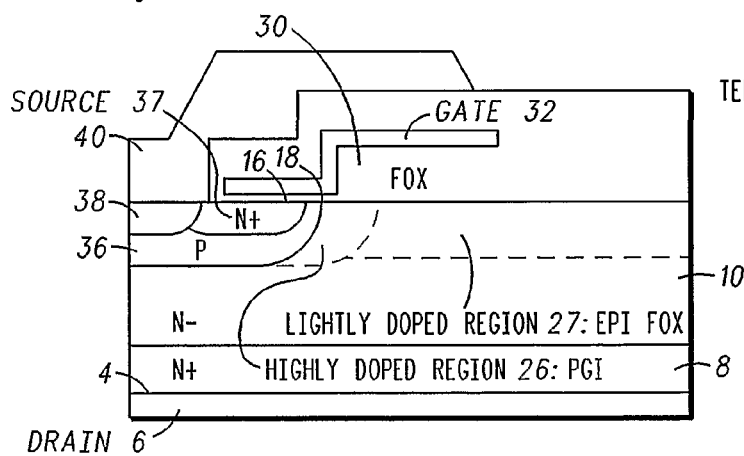
FIG. 10 is a cross-section similar to FIG. 7 of a termination cell at an edge of the array.

If a similar configuration to the basic cells as shown in FIG. 7 were used for the edge cells, a reduction of breakdown voltage of the switch device would occur compared to the capability of the basic cells. To avoid this reduction, in this embodiment of the invention the edge cells of the array, that is to say the termination cells closest to the edges of the die, have a different configuration as shown in FIG. 10, notably on their outer sides facing the adjacent die edge.

Like the basic cells, each of the edge cells comprises a source region 37 of the first conductivity type extending from the first face 2 and a base region 36 of the opposite conductivity type surrounding the source region at and below the first face. The base region 36 forms with the source region 37 and second drain layer 10 respectively a base-source junction 12 and a base-drain junction 14 both extending to the first face 2 so as to define respective junction perimeters 16 and 18 thereat. On the inner side of the edge cell, the gate electrode 32, insulated from the die, is disposed at the first face 2 extending over the base-source junction 12 and the base-drain junction 14 to form a conductive channel in the on-state of the device in the base region 36, like in the basic cells. On this inner side, the edge cell has a highly doped peripheral region 26 beside the perimeter 18 of the base-drain junction cooperating with the highly doped peripheral region 26 of the immediately adjacent basic cell in the array to form the trumpet shaped conduction path 24 and 22. On the outer side, a highly doped peripheral region 26 is also provided beside the perimeter 18 of the base-drain junction.

However, on the outer side of each edge cell facing the edge of the die, the gate electrode 32 extends over and beyond at least part of the perimeters 16 and 18 of the base-source junction and the base-drain junction towards the adjacent edge of the die. Moreover, on the outer side of each edge cell, the second drain layer 10 includes a region 27 of reduced dopant density that extends from the highly doped peripheral region 26 beyond the gate electrode right to the adjacent edge of the die.

In this embodiment of the invention, the thicker oxide layer 30 extends out to the edge of the die on the outer side of the edge cells. These features of the outer side of the edge cells maintain the breakdown voltage of the device that otherwise might be degraded in these outer sides.

The invention claimed is:
1. A vertical insulated gate field-effect transistor semiconductor device comprising:
 an array of cells formed in a die of semiconductor material presenting a first face and a second face opposite to said first face, with first and second superposed drain layers of a first conductivity type, the first drain layer extending from said second face and the second drain layer having a less high dopant density than said first drain layer and extending to said first face said array including basic cells and edge cells at the edges of said array, each of said basic cells comprising a source region of said first conductivity type extending from said first face a base region of the opposite conductivity type surrounding said source region at and below said first face, said base region forming with said source region and drain layers respectively a base-source junction and a base-drain junction both extending to said first face so as to define respective junction perimeters thereat, a gate electrode insulated from said die by an insulating layer and extending at said first face over at least part of said perimeters of said base-source junction and said base-drain junction at said first face, whereby to form a conductive channel in an on-state of the device in said base region between said source region and said drain layers in response to a gate voltage applied to said gate electrode; and an active drain region in said second drain layer at the first face between base regions of adjacent cells, the active drain region comprising:

peripheral regions extending beside respective perimeters of said base-drain junctions not deeper than the base regions, said peripheral regions being of higher dopant density than the rest of said second drain layer and an intermediate region between the peripheral regions in the centre of the active drain region provided with a lighter dopant density than the rest of the second drain layer so as to present to source-drain current a trumpet shaped conductivity path.

2. A semiconductor device as claimed in claim 1, wherein said intermediate regions in said second drain layer present a reduced dopant density adjacent said first face, at least in the vicinity of said peripheral region.

3. A semiconductor device as claimed in claim 2 further comprising:

edge cells at the edges of said array, each of said edge cells comprising a source region of said first conductivity type extending from said first face and a base region of the opposite conductivity type surrounding said source region at and below said first face, said base region forming with said source region and second drain layer respectively a base-source junction and a base-drain junction both extending to said first face so as to define respective junction perimeters thereat, and a gate electrode insulated from said die and disposed at said first face extending over and beyond at least part of said perimeters of said base-source junction and said base-drain junction at said first face towards the adjacent edge of the die, wherein said second drain layer in each of said cells includes a region of reduced dopant density that extends beyond said gate electrode towards the adjacent edge of the die.

4. A semiconductor device as claimed in claim 1, wherein said insulating layer is thinner in the vicinity of said junction perimeters than in areas adjacent said intermediate regions.

5. A method of making a vertical insulated gate field-effect transistor semiconductor device, wherein the a vertical insulated gate field-effect transistor semiconductor device includes an array of cells formed in a die of semiconductor material presenting a first face and a second face opposite to said first face, with first and second superposed drain layers of a first conductivity type, the first drain layer extending from said second face and the second drain layer having a less high dopant density than said first drain layer and extending to said first face, said array including basic cells and edge cells at the edges of said array; wherein each of said basic cells comprising: a source region of said first conductivity type extending from said first face, a base region of the opposite conductivity type surrounding said source region at and below said first face, said base region forming with said source region and drain layers respectively a base-source junction and a base-drain junction both extending to said first face so as to define respective junction perimeters thereat, a gate electrode insulated from said die by an insulating layer and extending at said first face over at least part of said perimeters of said base-source junction and said base-drain junction at said first face: whereby to form a conductive channel in an on-state of the device in said base region between said source region and said drain layers in response to a gate voltage applied to said gate electrode, and an active drain region in said second drain layer at the first face between base regions of adjacent cells, the active drain region comprising peripheral regions extending beside respective perimeters of said base-drain junctions not deeper than the base regions, said peripheral regions being of higher dopant density than the rest of said second drain layer and an intermediate region between the peripheral regions in the centre of the active drain region provided with a lighter dopant density than the rest of the second drain layer so as to present to source-drain current a trumpet shaped conductivity path, the method comprising:

producing said second drain layer wherein producing said second drain layer includes growing semiconductor material epitaxially on said first drain layer; and producing said source and base regions and said peripheral region includes, wherein said producing said source and base regions and said peripheral region includes introducing dopants into said second drain layer and diffusing said dopants therein.

6. A method of making a semiconductor device as claimed in claim 5 wherein the density of dopant in said second layer is reduced during the step of growing semiconductor material epitaxially on said first drain layer.

7. A method of making a semiconductor device as claimed in claim 5 further comprising:

forming a stack including said gate electrode on said first face;

introducing dopant for said peripheral regions into the die from said first face using said stack as masking; and subsequently introducing dopant for said base and source regions into the die from said first face using said stack as masking.

8. A method of making a semiconductor device as claimed in claim 6 further comprising:

forming a stack including said gate electrode on said first face;

introducing dopant for said peripheral regions into the die from said first face using said stack as masking; and subsequently introducing dopant for said base and source regions into the die from said first face using said stack as masking.

9. A semiconductor device as claimed in claim 2, wherein said insulating layer is thinner in the vicinity of said junction perimeters than in areas adjacent said intermediate regions.

10. A semiconductor device as claimed in claim 3, wherein said insulating layer is thinner in the vicinity of said junction perimeters than in areas adjacent said intermediate regions.

* * * * *